United States Patent [19]

Almond

[11] Patent Number: 4,916,275

[45] Date of Patent: Apr. 10, 1990

[54] TACTILE MEMBRANE SWITCH ASSEMBLY

[75] Inventor: Richard H. Almond, Longmont, Colo.

[73] Assignee: Square D Company, Palatine, Ill.

[21] Appl. No.: 180,870

[22] Filed: Apr. 13, 1988

[51] Int. Cl.4 ............................................. H01H 13/70
[52] U.S. Cl. ................................. 200/516; 200/5 A; 200/512
[58] Field of Search ................ 200/159 B, 262, 269, 200/5 A, 516, 512

[56] References Cited

U.S. PATENT DOCUMENTS

| 3,996,427 | 12/1976 | Kaminski | 200/5 A |
| 4,249,044 | 2/1981 | Larson | 200/5 A |
| 4,287,394 | 9/1981 | Hargita et al. | 200/5 A |
| 4,319,099 | 3/1982 | Asher | 200/5 A |
| 4,368,281 | 1/1983 | Brummett et al. | 174/68.5 X |
| 4,391,845 | 7/1983 | Denley | 200/512 |
| 4,449,023 | 5/1984 | Hilhorst et al. | 200/514 |
| 4,456,800 | 6/1984 | Holland | 200/516 |
| 4,736,190 | 4/1988 | Fiorella | 200/5 A X |
| 4,774,634 | 9/1988 | Tate et al. | 361/400 |
| 4,780,794 | 10/1988 | Mase et al. | 361/401 |

Primary Examiner—Renee S. Luebke
Attorney, Agent, or Firm—Michael J. Femal; Lloyd L. Zickert

[57] ABSTRACT

A tactile membrane switch assembly that includes at least one switch site having inner and outer contacts and a snap dome switch wherein the assembly includes a flexible substrate of electrically insulating material having a plurality of alternating layers of dielectric ink and electrically conductive ink patterned to define the inner and outer contacts and suitable conductive runs. A top layer of wear resistant carbon ink is applied to the outer contact and the snap acting dome switch which is conductive is mounted onto the switch site so that it peripherally engages the outer contact. A dome seal is applied over the snap dome switch to hold it in place and to seal the circuitry from contamination.

12 Claims, 4 Drawing Sheets

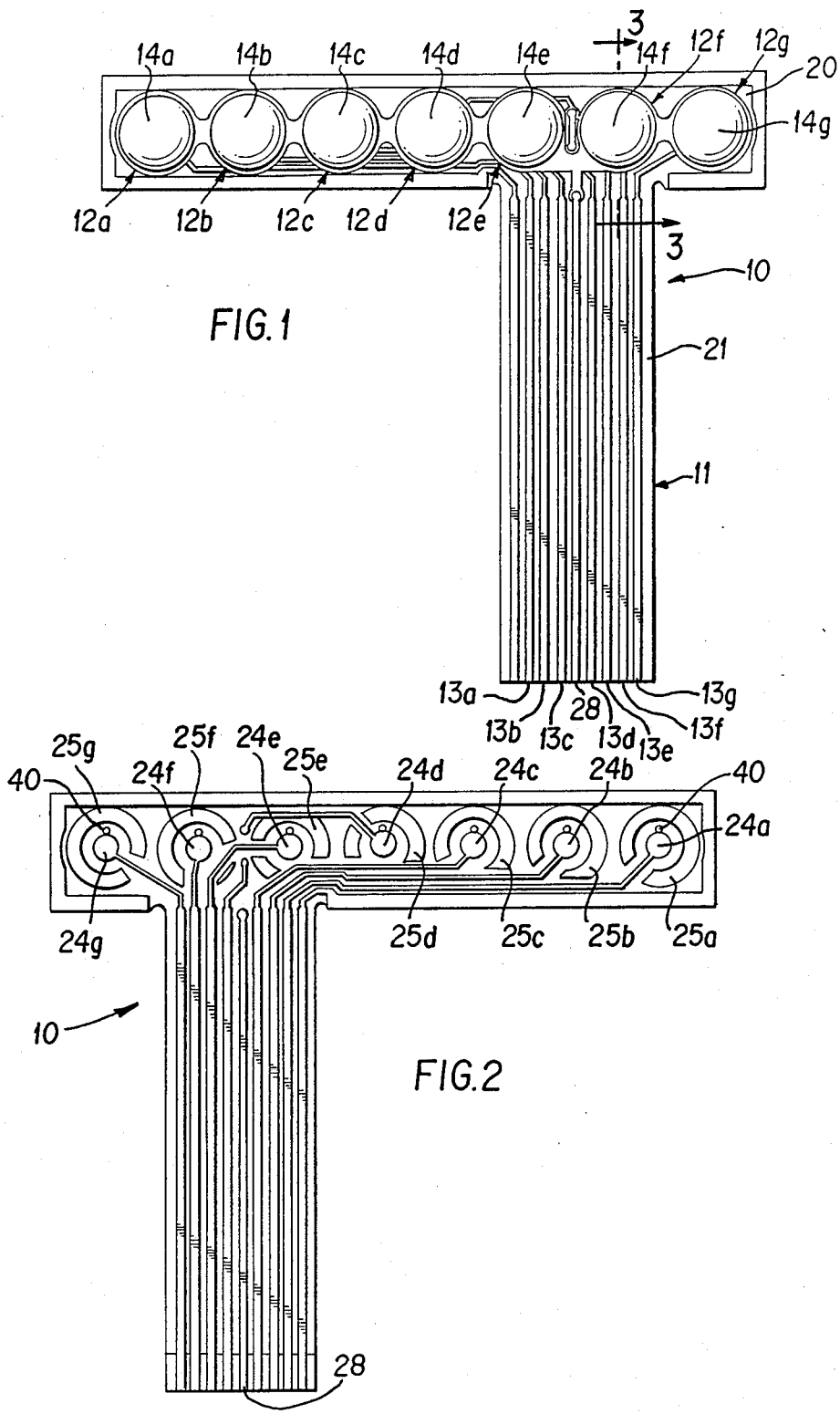

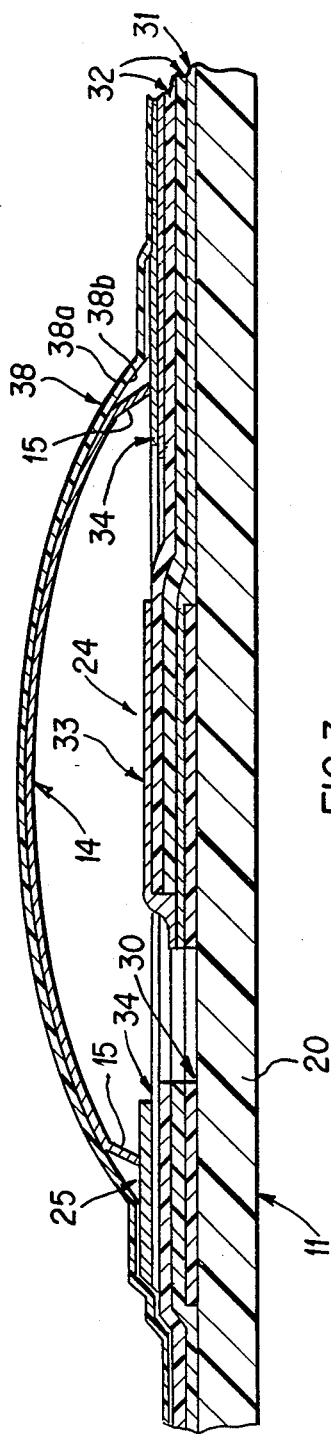
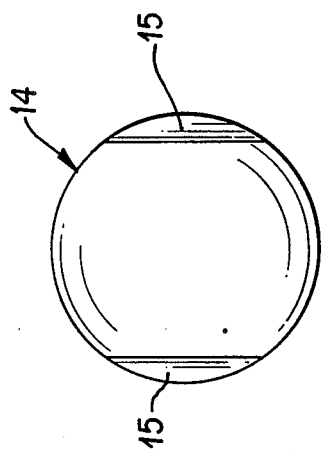

TACTILE MEMBRANE SWITCH ASSEMBLY

DESCRIPTION

This invention relates in general to a tactile membrane switch assembly for use in a keyboard assembly and more particularly to a switch assembly including circuitry screen printed onto a substrate defining at least one switch site and a snap dome switch for the switch site, at still more particularly to a tactile membrane switch assembly that is very thin and flexible.

BACKGROUND OF THE INVENTION

Heretofore it has been well known to provide keyboard units having tactile switch assemblies that use snap dome switches as disclosed in U.S. Pat. No. 3,967,084. It has also been well known to provide membrane switch assemblies that additionally include snap dome switches to produce a tactile feedback and which include a flexible substrate on which circuitry is formed as in U.S. Pat. No. 4,463,234. This patent also makes it known to silk screen print conductive paint or ink onto the substrate. However, it requires a plurality of sheets of material in stacked form which increases the difficulty in aligning one sheet with another and also increases the overall thickness of the assembly. Additionally when stacking several sheets in an assembly, it is necessary to connect adjacent sheets by adhesive which may adversely affect the reliability of the assembly.

SUMMARY OF THE INVENTION

The present invention obviates the above named difficulties and is directed to an improved tactile membrane switch assembly that is thinner than heretofore known assemblies and does not rely on the use of adhesive for connecting a plurality of sheets of material to form the membrane and which is unique in that it utilizes the snap dome switch as a conductor to close the switch during operation.

The tactile membrane switch assembly of the present invention includes a substrate of electrically insulating material such as a suitable polyester and on which is silk screen printed layers of non-conductive or dielectric ink and conductive ink or paint to define the circuitry and the switch sites. Metal snap dome switches are mounted and suitably secured to each of the switch sites whereupon pressing the snap dome switches cause closing of contacts in the circuits. Thus the assembly includes only a membrane having the switch circuitry applied thereto, the snap dome switches and a dome seal over the switches to ultimately define a very thin and reliable switch assembly. By screen printing the dielectric and conductive layers to the substrate, the contacts at each switch site are substantially the same height, the screen printing on the substrate is highly stable, and everything is accomplished by better registration of the circuitry components. The snap dome switches provide the best tactile feel while the advantage of thinness in membrane assemblies is retained. While the layers are described as being deposited by silk screening, they may also be deposited by transfer printing.

It is therefore an object of the present invention to provide a new and improved tactile membrane switch assembly that includes switch sites and conductive runs patterned on a single substrate by depositing a plurality of dielectric and conductive inks by screen printing techniques and including snap dome switches for closing contacts and providing tactile feel.

A further object of the present invention is in the provision of a new and improved tactile membrane switch assembly that is flexible and very thin and which utilizes only a single substrate on which is formed one or more switch sites and conductive runs, and on which is arranged snap dome switches that not only provide tactile feel but define the conductive path for closing contacts when depressed.

Another object of the present invention is the provision of an improved tactile membrane switch assembly that includes a relatively thin and highly flexible substrate of electrically insulating material having alternating layers of dielectric ink and conductive ink to define inner and outer contacts together with a top layer of carbon ink on the outer contact for wear resistance, and a conductive snap dome switch engaging the outer contact and upon being depressed to engage the center contact to electrically connect the contact wherein higher reliability is obtained because no adhesive is used to build the switch sites and the conductive runs.

Other objects, features and advantages of the invention will be apparent from the following detailed disclosure taken in conjunction with the accompanying sheets of drawings wherein like reference numerals refer to like parts.

BRIEF DESCRIPTION OF THE DRAWINGS

FIG. 1 is a top plan view of the tactile membrane switch assembly of the present invention;

FIG. 2 is a bottom plan view of the assembly shown in FIG. 1;

FIG. 3 is a greatly enlarged sectional view taken substantially along line 3—3 of FIG. 1 to illustrate a single switch site and the makeup of the circuitry on the substrate;

FIG. 4 is a top plan view of a snap dome switch used at the switch site;

DESCRIPTION OF THE INVENTION

Figure 5:
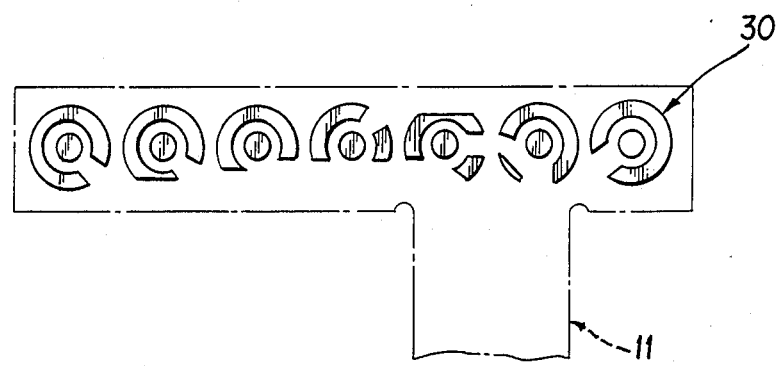
FIG. 5 is a top plan view of the first layer of ink applied to the substrate which is a dielectric ink.

The tactile membrane switch assembly of the present invention is used in keyboard assemblies which would include a key pad of suitable structure having a plurality of buttons, one for each switch site, or indicia defined areas for each switch site, so that the user can select and actuate any switch site to close a desired circuit. Keyboard assemblies are well known and for purposes herein reference may be had to any of the abovementioned patents for types of key pads that could be used with the switch assembly of the present invention.

While the switch assembly herein illustrates a single-sided circuit board, it will be appreciated that the invention may likewise be applied to a double-sided circuit board that would have circuitry applied to both sides of a substrate. Further, while the illustrated switch assembly herein shows a plurality of horizontally aligned switch sites, it will be appreciated that the invention may be employed in switch sites that may have a variety of arrays such as vertically arranged rows each having any desired number of switch sites. Finally, it should be appreciated that the switch assembly of the present invention may be applied to a single switch site for a single circuit.

Referring now to the drawings and particularly to FIGS. 1 and 2, the tactile membrane switch assembly of the present invention is generally indicated by the numeral 10 and includes generally a substrate 11 of electrically insulating material such as polyester on which layers of dielectric ink and layers of conductive ink are screen printed to define a plurality of switch sites 12a to 12g and conductive runs 13a to 13g corresponding to the switch sites.

Additionally, as will be apparent hereafter, a shielding conductive path encircles the switch sites and a common conductive path is used for electrically interconnecting one of the contacts of each of the switch sites. A snap dome switch 14 is mounted at each of the switch sites for connecting contacts at the switch site when depressed. While the snap dome switch 14 is of a type like that disclosed in U.S. Pat. No. 3,967,084, it will be appreciated it could be of any desired type that would serve to electrically connect inner and outer contacts at the switch site when depressed. These snap dome switches are made of a suitable metal or conductive material and configured so that when depressed, a tactile feedback will be sensed by the user when the switch goes through the snap phase to close a circuit. The tactile feel comes from a sudden decrease in force during actuation as the switch is deflected through over center position. Snap dome switch 14 includes a pair of opposed feet 15 as above-mentioned.

The substrate 11 includes a horizontally extending switch site portion 20 and a tongue portion 21. The tongue 21 essentially projects from the switch site portion to provide a means for conveniently connecting the assembly in a keyboard assembly and includes desired circuitry as the conductive runs from the switch sites are extended along the tongue. The polyester substrate is preferably of a thickness of about 0.007″ although it may be of a thickness in the range of 0.004″ to 0.010″ so that it will be suitably flexible for use in a keyboard assembly. Further, the polyester substrate is preferably optically clear but it may be translucent or even opaque if desired.

The switch sites and conductive runs are patterned on the substrate by conventional screened printing techniques with five layers of ink or paint that are successively applied and independently cured. Each layer is applied in registration with the previous layer so as to correctly and accurately define the switch sites and conductive runs and appropriately insulate the contacts of each switch site from each other, as best illustrated in FIG. 2. Each switch site 12 includes contact 24 and an outer contact 25. The inner contacts are connected through conductive runs to the respective conductive runs on the tongue bearing the same letter designation. For example, contact 24a connects to conductive run 13a. Each of the other contacts, 25a to 25g, is connected to a common conductive run 28.

Figure 6:
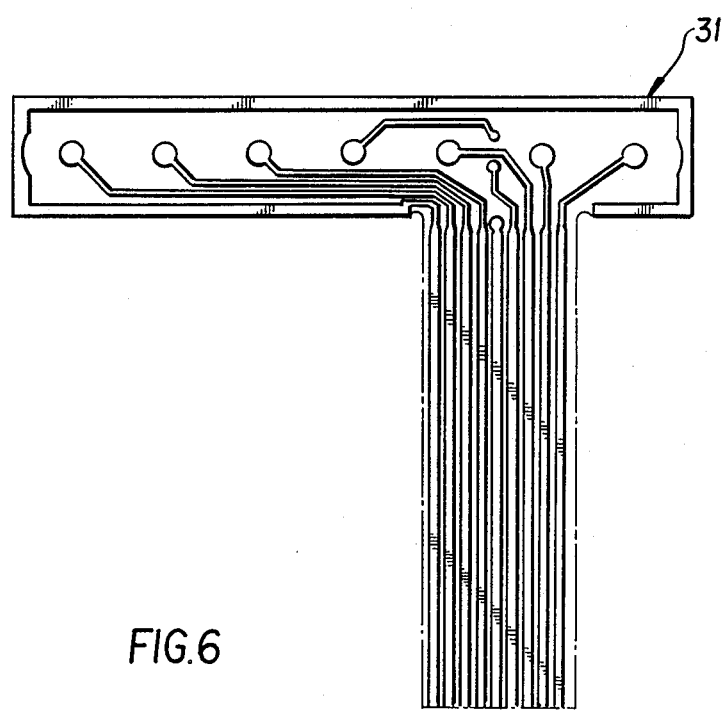
FIG. 6 is a top plan view of the second layer of ink applied to the substrate and over the first layer and is a silver conductive layer.
Figure 7:
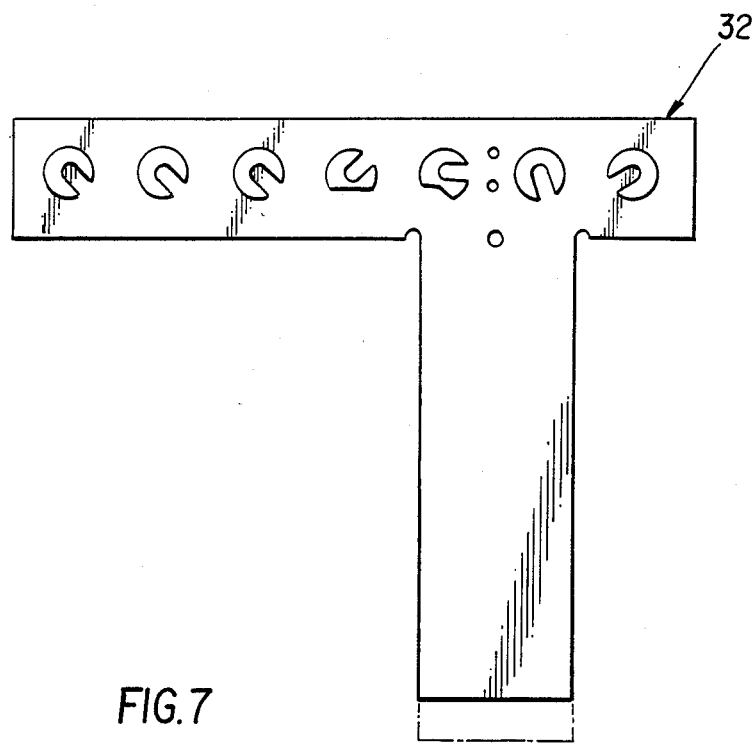
FIG. 7 is a top plan view of the third layer of ink applied to the substrate and over the second layer and which is a layer of dielectric ink.
Figure 8:
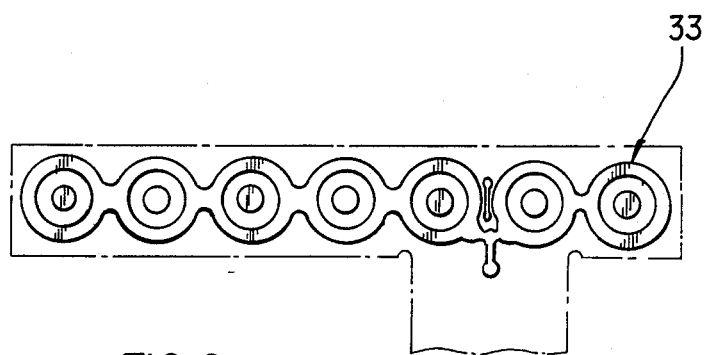
FIG. 8 is a top plan view of the fourth layer of ink applied over the third layer and which is a layer of silver conductive ink.
Figure 9:
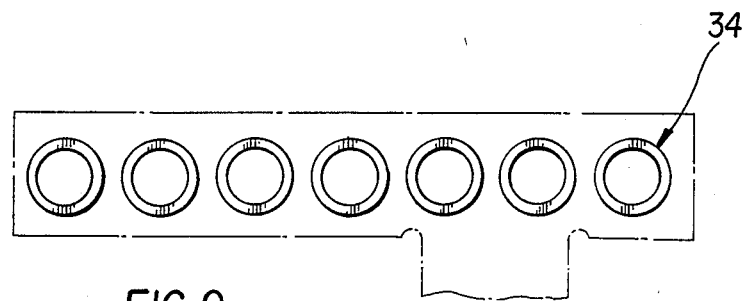
FIG. 9 is a top plan view of the fifth layer of ink applied over the fourth layer which constitutes a conductive wear resistant layer of carbon.

The entire circuit is built onto substrate 11 by first applying a dielectric layer 30, FIGS. 3 and 5, and in succession, a conductive layer 31, FIGS. 3 and 6, a dielectric layer 32, FIGS. 3 and 7, a conductive layer 33, FIGS. 3 and 8, and a carbon conductive layer 34, FIGS. 3 and 9. Thus the first and third layers are dielectric layers while the second, fourth and fifth layers are conductive layers.

The dielectric layer 30 is made of a suitable ultraviolet curable dielectric ink and its purpose is to stack up the outer ring of the contact of outer contact 25 as well as the inner contact 24. This layer, in a form shown in FIG. 5, is screen printed onto the substrate and thereafter cured by ultraviolet treatment. It is about one-thousanth of an inch thick, that is, 0.001 inch thick. The next layer, 31, which is conductive, is of a thermopolymer silver-filled ink and its purpose is to provide circuitry connection of the center or inner contacts 24. It is about 0.00075 inch in thickness and is heat cured by any suitable means.

The second dielectric layer 32 is then applied over layer 31 and serves to cross over at the point where layer 31 is underneath fourth conductive layer 33. Dielectric layer 32 is applied in two passes, each about 0.001 inch thick. After the first pass is cured, a second pass is applied and cured providing a thickness of about 0.002 inch.

The second conductive layer 33 is then applied over the dielectric layer 32 and in registry to provide the circuitry connections for the outer contacts. Here it should be noted that the center pad in dielectric layer 32 is smaller than the center silver pad of layer 31, thereby allowing the center pad area of layer 33 to electrically connect around the edge to the center pad on layer 31. This layer serves to substantially place the inner and outer contacts at about the same height and will provide better life expectancies for the snap dome switches that are used at the switch sites. It is about the same thickness as layer 31, which is 0.00075 inch and is also heat cured after it has been applied.

The last layer, 34, is applied over layer 33 and is made of a thermopolymer carbon-filled ink and covers the ring contact so as to provide an abrasion resistant surface on which the dome 15 will ride. This layer is about 0.001″ in thickness and is also heat cured. It is slightly thicker than the conductive layer 33 and harder so that it defines good resistance to wear during actuation of the snap dome switch. This layer also includes graphite so that it is self-lubricating for the snap dome switch.

It will be understood that the ink layers are flexible so that the entire printed circuit board consisting of the substrate and the ink layers is flexible.

From the foregoing it can be appreciated that the entire circuit is built up on a single substrate and is thinner than a conventional rigid printed circuit board. Next the snap dome switches 14 are mounted in place on the switch sites 12 by a suitable procedure and then sealed and secured in place to the printed substrate by having a dome seal 38 completely overlying the domes and particularly that part of the circuit that is in the switch site portion 20 of the substrate. The dome seal 38 includes a flexible polyester insulating film 38a and an adhesive layer 38b on the underside for adhering the dome seal to the dome and the switch site portion 20. A vent 40 is provided in the substrate at each switch site to vent the area beneath the dome.

In operation depressing of a dome 14 which peripherally engages the outer contact 25 will cause the dome to snap and engage in the center area of the dome with the inner contact 24 which then electrically connects the contacts.

It will be understood that modifications and variations may be effected without departing from the scope of the novel concepts of the present invention. But it is understood that this application is to be limited only by the scope of the appended claims.

The invention is hereby claimed as follows:

1. A flexible and thin tactile switch assembly including at least one switch site with an inner contact and an outer contact, said assembly comprising,
    a substrate of polyester,
    a plurality of stacked layers of ink deposited on said substrate and defining said contacts and conductive runs including,
    a first layer of dielectric ink outlining the switch site with inner and outer contact areas,
    a second layer of conductive ink defining the inner contact and at least a pair of conductive runs, one run connecting to the inner contact and the other run to be connected to the outer contact and connecting to said other run, and
    a third layer of dielectric ink covering the conductive run for the inner contact,
    a fourth layer of conductive ink defining the outer contact and connecting to said other run, and
    a fifth layer of wear conductive ink on the outer contact, and
    a snap dome switch secured in place on the switch site to peripherally engage said outer contact and which upon being depressed to snap will engage the inner contact and electrically connect the contacts.

2. The assembly of claim 1, wherein said contacts are substantially the same thickness.

3. The assembly of claim 1, which further includes a dome seal overlying said dome and switch site to prevent contamination of the switch site.

4. The assembly of claim 1, wherein said layers are screen printed onto said substrate, the dielectric layers being ultraviolet curable and the conductive layers being heat curable.

5. The assembly of claim 4, wherein said second, fourth and fifth layers are thermopolymer conductive-particle filled inks.

6. The assembly of claim 5, wherein said snap dome switch is metal.

7. The assembly of claim 6, wherein the thickness of said substrate is in the range of 0.004 to 0.010 inch.

8. The assembly of claim 7, wherein the thickness of said first layer is about 0.001 inch, the thickness of said second layer is about 0.00075 inch, the thickness of said third layer is about 0.002 inch, the thickness of said fourth layer is about 0.00075 inch, and the thickness of said fifth layer is about 0.001 inch.

9. A flexible and thin tactile membrane switch assembly including a plurality of switch sites, each of which includes an inner and an outer contact, said assembly comprising,
    a flexible substrate of insulating material,
    a plurality of stacked layers of ink deposited on said substrate and defining said contacts and conductive runs from the contacts including,
    a first layer of dielectric ink for stacking up the outer contacts,
    a second layer of conductive ink defining the inner contact areas and conductive runs for the contact areas, one run connecting to each of the inner contact areas, and the other run adapted to be connected to the outer contact areas,
    a third layer of dielectric ink covering a part of the inner contacts and the conductive runs therefrom and most of the conductive run to be connected to the outer contacts,
    a fourth layer of conductive ink defining the inner and outer contact areas and connecting to said other run of said second layer, the inner contact areas electrically connecting with the inner contact areas of said second layer,
    and a fifth layer of wear resistant conductive ink on the outer contact areas of said fourth layer, and a snap dome switch for each switch site riding on the outer contacts and engaging the inner contacts when depressed to snap to electrically connect the contacts.

10. The assembly of claim 9, which further includes a dome seal overlying said dome switches and switch sites to secure the dome switches in alignment with said sites and prevent contamination of said sites.

11. The assembly of claim 10, wherein said layers are screen printed onto said substrate, the dielectric layers being ultraviolet cured and the conductive layers being heat cured.

12. The assembly of claim 11, wherein said contacts are substantially the same thickness.

* * * * *